United States Patent [19]

Ohta et al.

[11] Patent Number: 5,058,527
[45] Date of Patent: Oct. 22, 1991

[54] THIN FILM FORMING APPARATUS

[75] Inventors: Wasaburo Ohta; Masashi Nakazawa, both of Yokohama, Japan

[73] Assignee: Ricoh Company, Ltd., Tokyo, Japan

[21] Appl. No.: 557,375

[22] Filed: Jul. 24, 1990

[51] Int. Cl.$^5$ .......................... C23C 8/36; C23C 14/32; C23C 16/48; C23C 16/50

[52] U.S. Cl. .................................... 118/723; 118/715; 118/725

[58] Field of Search ................. 118/723, 715, 725; 204/192.31, 298.05

[56] References Cited

U.S. PATENT DOCUMENTS

| 4,774,416 | 9/1988 | Askary | 250/492.2 |
| 4,974,544 | 12/1990 | Ohta | 118/723 |

FOREIGN PATENT DOCUMENTS

| 89763 | 5/1984 | Japan . | |
| 60-39832 | 3/1985 | Japan | 156/345 |
| 61-113775 | 5/1986 | Japan . | |
| 63-187619 | 8/1988 | Japan | 118/723 |
| WO87/0310 | 12/1987 | PCT Int'l Appl. . | |

Primary Examiner—Richard Bueker
Attorney, Agent, or Firm—Cooper & Dunham

[57] ABSTRACT

A thin film forming apparatus for forming a thin film on a substrate with a vaporized source material being supplied from an external material supplying unit. The thin film forming apparatus comprises a vacuum chamber for providing a vacuum pressure at which the vaporized source material is deposited on the substrate, a material supplying part for supplying particles constituting the vaporized source material to the vacuum chamber, an electrode for holding the substrate, a grid for allowing the particles to travel from the material supplying part to the electrode through the grid, a filament for generating thermions to ionize the particles, a power supply for applying a voltage to the grid so that the grid has a positive potential when measured with respect to the electrode and with respect to the filament, a plurality of openings being formed on the material supplying part for directing the emitted particles from the plurality of openings toward the substrate, and an emission uniforming material for uniforming the quantity of the emitted particles.

7 Claims, 1 Drawing Sheet

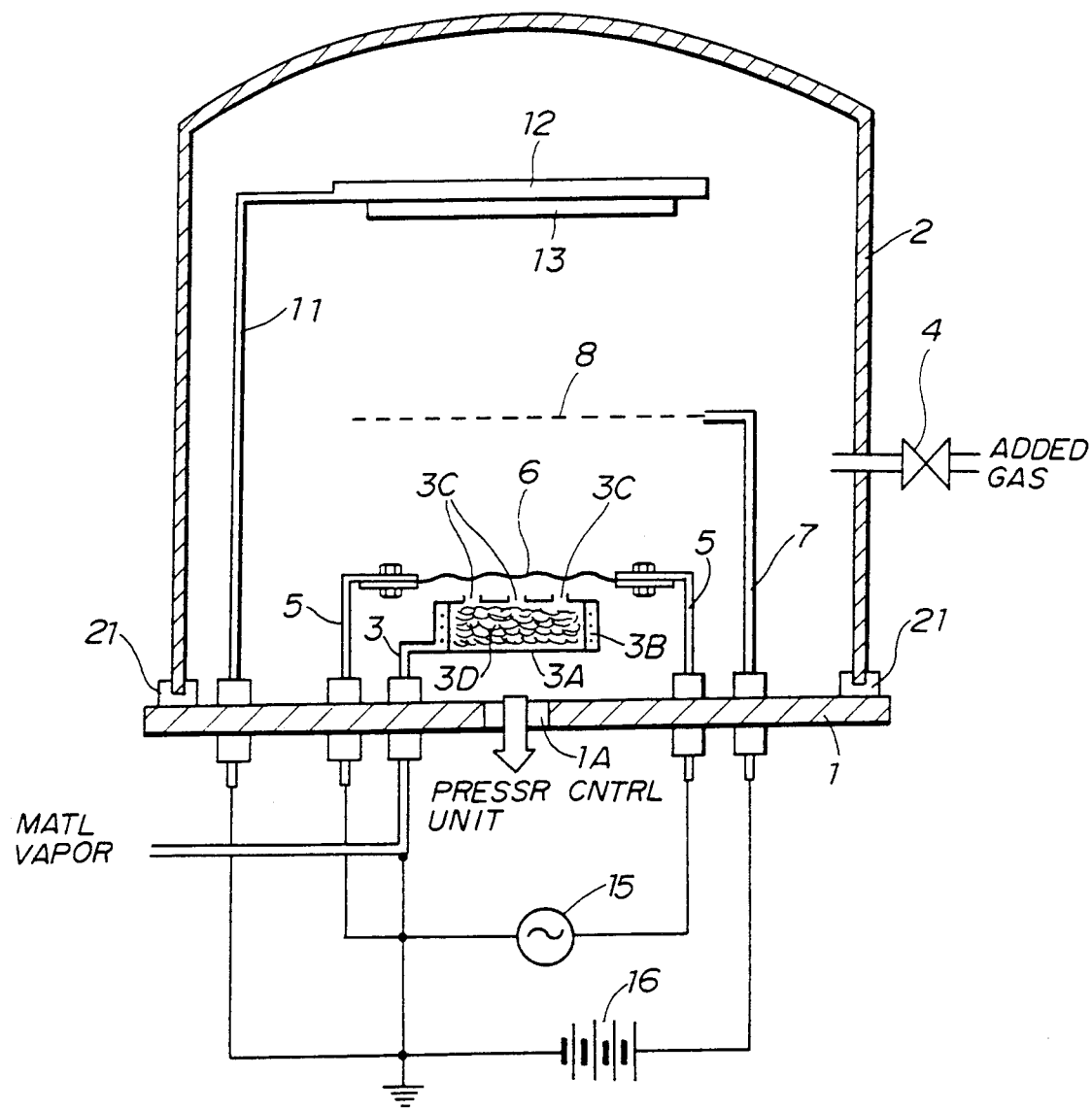

THIN FILM FORMING APPARATUS

BACKGROUND OF THE INVENTION

The present invention generally relates to thin film forming apparatus, and more particularly to a thin film forming apparatus for forming a thin film on a substrate made of a material less resistant to heat than glass, which is applied to the manufacture of plastic lenses, large scale integrated circuits, etc.

There is a conventional thin film forming apparatus for forming a thin film with good adhesion and uniform density on a substrate made of a material such as plastic which is less resistant to heat than glass. Such a conventional apparatus provides a resultant film showing good characteristics, but usually employs a common vaporization unit for vaporizing a source material into vapor before depositing the source material on the substrate. With the common vaporization unit used in the conventional thin film forming apparatus, the kind of source materials selectable and the combination of source materials usable are limited, and the quantity of source material vapors to be deposited on the substrate is difficult to control to obtain a desired thin-film circuit or a desired thin film lense. Also the conventional thin film forming apparatus employing such a common vaporization unit usually has a problem in that the substrate on which the source material is deposited has a relatively great area. That is, it is difficult for the conventional apparatus to provide a resultant film formed on a substrate having a relatively great area with a uniform density.

SUMMARY OF THE INVENTION

Accordingly, it is a general object of the present invention to provide a novel and useful thin film forming apparatus in which the above described problems are eliminated.

Another and more specific object of the present invention is to provide a thin film forming apparatus for forming a thin film on a substrate with a vaporized source material being supplied from an external material supplying unit, the thin film forming apparatus comprising a vacuum chamber for providing a vacuum pressure at which the vaporized source material is deposited on the substrate, a material supplying part for supplying particles constituting the vaporized source material to the vacuum chamber, an electrode for holding the substrate when the source material is deposited on the substrate, the electrode having a surface on which the substrate is held, the surface facing the material supplying part, a grid being provided between the material supplying part and the electrode, the grid allowing the particles to travel from the material supplying part to the substrate through the grid, a filament being provided between the grid and the material supplying part to carry out thermionic emission, the filament supplying thermions that ionize the particles to emit the thus ionized particles from the material supplying part, an electric power supply for applying a voltage to the grid so that the grid has a positive potential when measured with respect to the electrode and with respect to the filament, a plurality of openings being formed on a surface of the material supplying part confronting the electrode, the plurality of openings serving to direct the emitted particles from the material supplying part toward the substrate, and an emission uniforming material being provided within the material supplying part for uniforming the quantity of the particles emitted from the material supplying part through each of the plurality of openings. According to the present invention, it is possible to easily and reliably form a thin film of uniform density on the substrate of a material which is less resistant to heat than glass. A large part of the thermions putting a significant thermal influence on the substrate are attracted and absorbed by the grid, the thermal energy of the thermions being used for ionization of the particles constituting the source material vapors. Hence, it is possible to ensure that a thin film has good characteristics even when it is deposited on a substrate made of such a material as, for example, a plastic less resistant to heat than glass. Thus, with the thin film forming apparatus of the present invention, it is possible to choose from a wide range of alternative source materials which can be formed into a thin film on the substrate. Further, the present invention facilitates the forming of a thin film of uniform density on a substrate with a relatively large area.

Other objects and further features of the present invention will be apparent from the following detailed description when read in conjunction with the accompanying drawing.

BRIEF DESCRIPTION OF THE DRAWING

The drawing is a schematic cross sectional view of a preferred embodiment of the thin film forming apparatus according to the present invention.

DESCRIPTION OF THE PREFERRED EMBODIMENT

Referring to the drawing, a description will be given of the preferred embodiment of the thin film forming apparatus in greater detail.

A vacuum chamber is generally made up of a base plate 1 and a bell jar 2 with a packing 21 between the base plate 1 and the bell jar 2 for sealing. The vacuum chamber provides a vacuum pressure at which a source material in the form of vapor is deposited on a substrate. When required, an active gas and/or an inert gas, or a mixture thereof, may be introduced into the vacuum chamber as an auxiliary gas The kind of thin film formed by the thin film forming apparatus of the invention is determined by the source material and the auxiliary gas being selected. For example, in order to produce a thin carbon or diamond film on the substrate, it is necessary to use an organic compound such as methane gas, or alcohol vapor as the source material, with hydrogen gas ($H_2$) as the auxiliary gas. Also, the selection of $SiH_4$ vapor as the source material together with argon gas as the auxiliary gas results in the making of an amorphous silicon film on the substrate. In addition, the reaction of $SiH_4$—$NH_3$ in the presence of argon gas (Ar) or nitrogen gas ($N_2$) within the vacuum chamber enables a thin SiN film to be formed on the substrate.

A tube 3 is provided on the base plate 1 for supplying a vaporized source material from an external material supplying unit to a material supplying part 3A discussed below. The tube 3 is used both as a supporting member of the material supplying part 3A and as an electrode. Extending across the base plate 1 from the inside to the outside of the vacuum chamber are a pair of first electrodes 5, a second electrode 7 and a third electrode 11 which are similarly used both as supporting members and as and electrodes. The first electrodes 5 support a filament 6 at both its end portions. The second electrode 7 supports a grid 8 at one of its end portions and the third electrode 11 supports a counter electrode 12 at one of its end portions. Base plate portions where the tube 3 and the electrodes 5, 7, 11 extend across the base plate 1 are built by an appropriate member to ensure the airtightness of the inside of the vacuum chamber. The tube 3 and the electrodes 5, 7, 11 are each electrically isolated from the base plate 1 by using a suitable insulation material. The vacuum chamber communicates with a suitable external pressure control unit (not shown) through an opening 1A which is perforated at the center of the base plate 1. The external pressure control unit is, for example, a vacuum pump which is capable of providing a desired vacuum pressure in the vacuum chamber.

The filament 6 is supported by a suitable member which is located between the pair of first electrodes 5. The filament 6 being connected between the electrodes 5 is provided to perform thermionic emission which allows ionization of the source material vapors supplied into the vacuum chamber. The source material vapors are supplied from an external material supplying unit to the vacuum chamber through a material supplying path. The tube 3 constitutes a part of the material supplying path as well as functioning as a supporting member of the material supplying part 3A. The filament 6 is made from a suitable metal wire such as tungsten. The filament 6 is formed, for example, by arranging a plurality of filament wires into a wire network so that particles making up the source material vapors can go through the filament 6, and the filament 6 can cover a widely spread emission of the source material vapors supplied from the external material supplying unit. Or, the filament 6 may be constructed by arranging a plurality of parallel filament wires which can play the same role as that described above. A power supply 15 is connected between the terminals of the first electrodes 5 extending beneath the base plate 1 so that electric energy from the power supply 15 converts into thermal energy in the form of thermions at the filament 6 through which an electric current flows. In this embodiment, an a.c. power supply is used as the power supply 15, but a d.c. power supply may be used instead.

A substrate 13 on which a thin film is formed is supported on the electrode 12 in a suitable manner, as shown. In this embodiment, a mesh-like grid is used to allow the particles of the source material vapors to smoothly go through the grid 8 and reach the substrate 13 held on the electrode 12. The tube 3 is used both as a supporting member and as an electrode. The tube 3 at one end thereof supports the material supplying part 3A within the vacuum chamber, and, at the other end thereof, it is connected to an external material supplying unit which supplies a vaporized source material to the vacuum chamber. Thus, the tube 3 constitutes a part of the material supplying path extending from the external material supplying unit to the material supplying part 3A within the vacuum chamber.

The material supplying part 3A which is provided within the vacuum chamber has a plurality of openings 3C on its surface facing the counter electrode 12. The vapors of the source material are emitted from each of the plurality of openings 3C toward the electrode 12. An emission uniforming material 3D is provided inside the material supplying part 3A for uniforming the quantity of the particles constituting the source material vapors which are emitted from each of the plurality of openings 3C. In this embodiment, a glass wool for example is used as the emission uniforming material 3D. Further, at an appropriate portion inside or in the vicinity of the material supplying part 3A, a heater member 3B is provided for supplying thermal energy to the source material vapors existing inside the material supplying part 3A. The heater member 3B is connected to a suitable electrical power supply through the tube 3 which is used as an electrode.

The plurality of openings 3C are preferably arranged at appropriate positions on a surface of the material supplying part 3A to cover the size and shape of the substrate 13. And, in such a case where the plurality of openings 3C are provided at the appropriate portions, it is preferred that a shape and arrangement of the filament 6 as well as of the grid 8 suitable for covering the size and shape of the substrate be selected. For example, in the case where a narrow, long substrate is used, a better arrangement for the apparatus is one where the plurality of openings 3C are located at appropriate positions on the surface of the material supplying part 3A to cover the size and shape of such a slender substrate, and the filament 6 and the grid 8 have a suitable size and shape suitable for covering the size and shape of that substrate. This will allow a resultant film formed on the substrate to be easily provided with a desired uniform density.

In this embodiment, one of the first electrodes 5, the electrode 11 and the tube 3 which all extend beneath the base plate 1 are grounded as shown in the drawing. However, these electrodes do not necessarily have to be grounded in the present invention. For instance, it is possible to provide a bias voltage source so that a bias voltage is applied to the electrode 11 and to the electrode 3 while the other end of the bias voltage supply is grounded. And a d.c. power supply 16 as the electrical member is connected between the electrode 7 and the electrode 11 so that the grid 8 has a positive potential measured with respect to the counter electrode 12 when a voltage is applied to the electrode 7 by the d.c. power supply 16. In an actual thin film forming apparatus, there are additionally provided several switches for connecting and disconnecting the electrodes with respect to the above described electric circuitry to achieve the overall process of thin film forming by operating the switches of the actual thin film forming apparatus, but such switches are not indicated in the drawing.

Next, a description will be given of the thin film forming procedure of the present invention.

The substrate 13 is first supported on the counter electrode 12 as indicated, and the pressure within the vacuum chamber is reduced by the external pressure control unit (not shown) to a vacuum pressure in a range between $10^{-3}$ Pa and $10^{-5}$ Pa. The auxiliary gas, when required, is introduced into the vacuum chamber by adjusting the valve 4, and the pressure in the vacuum chamber in such a case becomes a pressure in a range between $10^{-2}$ Pa and $10^2$ Pa. Introducing the auxiliary gas into the vacuum chamber may be made optionally only when it is necessary to use the auxiliary gas. The auxiliary gas used may be any suitable combination of an inert gas such as argon and an active gas such as hydrogen, oxygen, nitrogen, etc.

In this condition, the source material in the form of vapor or mist is supplied to the material supplying part 3A from the external material supplying unit through the tube 3, while a voltage of approximately 100 V is applied to the grid 8. With an electric power of approximately 400 W applied, a current flows through the filament 6, and thermions are generated from the filament 6. The vapors of the source material which occupy the inside of the material supplying part 3A are made uniform with the aid of the emission uniforming material 3D, and are emitted in a uniform manner from each of the plurality of openings 3C on the surface of the material supplying part 3A so that particles constituting the source material vapors are emitted from the openings 3C toward the substrate 12 in such a manner as to be widely spread, therefore enabling the particles to cover the substrate having a relatively large area.

Thermions thus generated from the filament 6 collide with the particles constituting the source material vapors so that the particles are ionized. When the auxiliary gas is transmitted to the vacuum chamber, the thermions from the filament 6 ionize a part of the auxiliary gas, and the ionized auxiliary gas further ionizes a part of the particles of the source material vapors by colliding with them. A force due to a electric field produced between the grid 8 and the filament 6 acts on the ionized particles of the source material vapors so that the grid 8 repels such positive ions and the filament 6 attracts them. In other words, when the ions of the source material vapors are moving from the filament 6 to the grid 8, they are decelerated because the grid 8 has a positive potential when measured with respect to the filament 6. However, the kinetic energy of the particles making up the source material vapors usually is great enough to overcome such a deceleration force, allowing the particles to pass through the grid 8. In this manner, a plasmatic atmosphere is created within the vacuum chamber. When the kinetic energy of the ions of the source material vapors is not large enough and only a small number of the ions can go through the grid 8, it is necessary to heat the source material vapors inside the material supplying part 3A by means of the heater member 3B so that the necessary kinetic energy of the ions is attained.

The generated thermions are attracted by the grid 8 to which a voltage is applied and are moved in an oscillatory manner in the vicinity of the grid 8 and ionize the vapors of the source material in the same manner as described above. And the thermions accordingly lose energy gradually and are finally absorbed by the grid 8. In contrast, a force due to an electric field produced between the grid 8 and the counter electrode 12 acts on the positive ions of the source material vapors which travel through the grid 8 so that the counter electrode 12 attracts the positive ions, and the ions are accelerated until they reach the substrate 13. Then, the ions of the source material vapors collide at high speed with the substrate 13 being held on the counter electrode 12 so that the source material is deposited on the substrate 13 to form a thin film on the substrate 13. When the auxiliary gas is introduced into the vacuum chamber, the ions of the auxiliary gas also serve to ionize the particles constituting the source material vapors existing between the grid 8 and the substrate 13.

As described above, the thermions from the filament 6 are absorbed by the grid 8 and the substrate on which the thin film is deposited does not suffer a significant thermal impact. Thus, it is possible for the thin film forming apparatus of the invention to form a thin film on the substrate made of not only a glass material but also a plastic material that is less resistant to heat than glass. And it is possible to easily and reliably form a source material into a thin film with uniform density and good adhesion to the substrate.

Further, the present invention is not limited to the above described embodiment but various variations and modifications may be made without departing from the scope of the present invention.

What is claimed is:

1. A thin film forming apparatus for forming a thin film on a substrate with a vaporized source material being supplied from an external material supplying unit, said thin film forming apparatus comprising:

a vacuum chamber for providing a vacuum pressure at which the vaporized source material is deposited on the substrate;

material supplying means for supplying particles constituting the vaporized source material to the vacuum chamber;

electrode means for holding the substrate when the source material is deposited on the substrate, said electrode means having a surface on which the substrate is held, said surface facing the material supplying means;

grid means provided between the material supplying means and the electrode means, said grid means allowing said particles to travel from said material supplying means to the substrate through the grid means;

filament means provided between the grid means and the material supplying means for carrying out thermionic emission, said filament means supplying thermions that ionize said particles to emit the thus ionized particles from the material supplying means;

electrical means for applying a voltage to the grid means so that the grid means has a positive potential when measured with respect to the electrode means and with respect to the filament means;

a surface of said material supplying means having a plurality of openings confronting said electrode means, said plurality of openings serving to direct said emitted particles from said material supplying means toward the substrate; and emission uniforming means provided within said material supplying means, said emission uniforming means being made of a glass wool and uniforming the quantity of said particles emitted from said material supplying means through said plurality of openings.

2. A thin film forming apparatus as claimed in claim 1, further comprising gas introducing means for introducing an auxiliary gas into the vacuum chamber, said gas introducing means comprising valve means for controlling a flow of said auxiliary gas to be introduced into the vacuum chamber, said vaporized source material being deposited on the substrate in the presence of said auxiliary gas within said vacuum chamber.

3. A thin film forming apparatus as claimed in claim 2, wherein said material supplying means further comprises tube means for connecting the external material supplying unit to said material supplying means so that the vaporized source material is supplied to the vacuum chamber through said tube means, said tube means serving concurrently as a supporting member of said material supplying means.

4. A thin film forming apparatus as claimed in claim 3, wherein said material supplying means further comprises heater means for supplying thermal energy to the vaporized source material existing inside said material supplying means.

5. A thin film forming apparatus as claimed in claim 4, wherein the electrode means and the filament means are grounded and a voltage is applied by said electrical means to the grid means to produce a first electric field between the grid means and the filament means as well as a second electric field between the grid means and the electrode means, said ionized particles being attracted by the filament means and repelled from the grid means in the first electric field, and said ionized particles being attracted by the electrode means in the second electric field.

6. A thin film forming apparatus as claimed in claim 1, wherein said substrate is made of a material which is a plastic less resistant to heat than glass.

7. A thin film forming apparatus as claimed in claim 1, wherein said surface of said material supplying means has the plurality of openings at appropriate positions to cover the size and shape of said substrate, and said grid means and said filament means are formed to have a size and shape which covers the size and shape of said substrate on which the source substrate is deposited.

* * * * *